United States Patent [19]

Sterling et al.

[11] 4,353,938
[45] Oct. 12, 1982

[54] COATING POWDER WITH VALVE-METAL

[75] Inventors: Henley F. Sterling, Great Dunmow; Eric L. Bush, Matching Green, Nr. Harlow; Miles P. Drake, Harlow; Denis W. J. Hazelden, Bishop's Stortford; Sarah Y. Hughes, Harlow, all of England

[73] Assignee: International Standard Electric Corporation, New York, N.Y.

[21] Appl. No.: 172,574

[22] Filed: Jul. 28, 1980

[51] Int. Cl.³ .............................................. B05D 7/00
[52] U.S. Cl. ...................................... 427/214; 427/80; 427/81; 427/217; 427/222; 427/251; 427/255; 427/255.2; 427/255.5; 427/255.7; 427/241; 427/404; 118/716; 118/730
[58] Field of Search .................... 427/81, 80, 213, 214, 427/217, 222, 251, 255, 255.2, 255.5, 241, 404, 124, 255.7; 118/716, 722, 726, 730; 361/433

[56] References Cited

U.S. PATENT DOCUMENTS

| | | | |
|---|---|---|---|
| 2,846,971 | 8/1958 | Baer et al. | 118/716 |
| 3,248,612 | 4/1966 | Rogers | 427/217 |
| 3,429,295 | 2/1969 | Shapiro | 118/716 |
| 3,518,500 | 6/1970 | Jimerson et al. | 361/433 |
| 3,611,051 | 10/1971 | Puppolo | 361/433 |
| 3,912,829 | 10/1975 | Takahashi et al. | 427/255.3 |
| 3,927,228 | 12/1975 | Pulker | 427/255.3 |
| 4,050,951 | 9/1977 | Piccolo et al. | 427/215 |
| 4,068,038 | 1/1978 | Montiglio et al. | 427/215 |
| 4,242,982 | 1/1981 | Drake et al. | 118/716 |

FOREIGN PATENT DOCUMENTS 52-9897   1/1977   Japan .......................... 427/255.3

Primary Examiner—Norman Morgenstern
Assistant Examiner—Richard Bueker
Attorney, Agent, or Firm—John T. O'Halloran; Peter R. Ruzek

[57] ABSTRACT

Powder is coated with valve-metal by rotating it in a drum 15 so that it is presented to valve-metal vapor derived by evaporation of a source of valve-metal. In the case of coating with aluminum, the vapor may be produced by directing aluminum wire 10 on to a heater 11, and oxygen or air is admitted to control agglomerate formation. Aluminum and tantalum coating are both described using electron beam evaporators.

17 Claims, 5 Drawing Figures

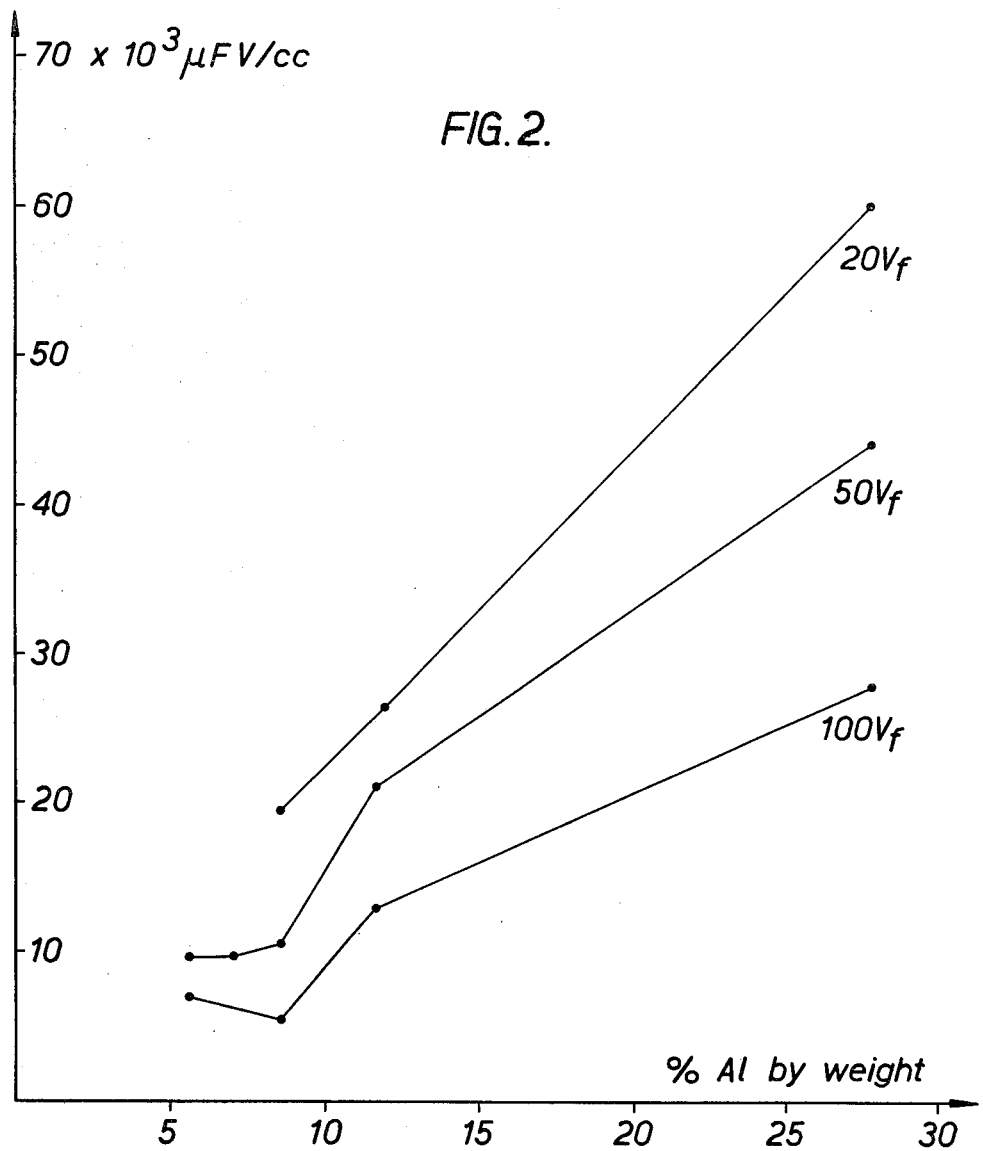

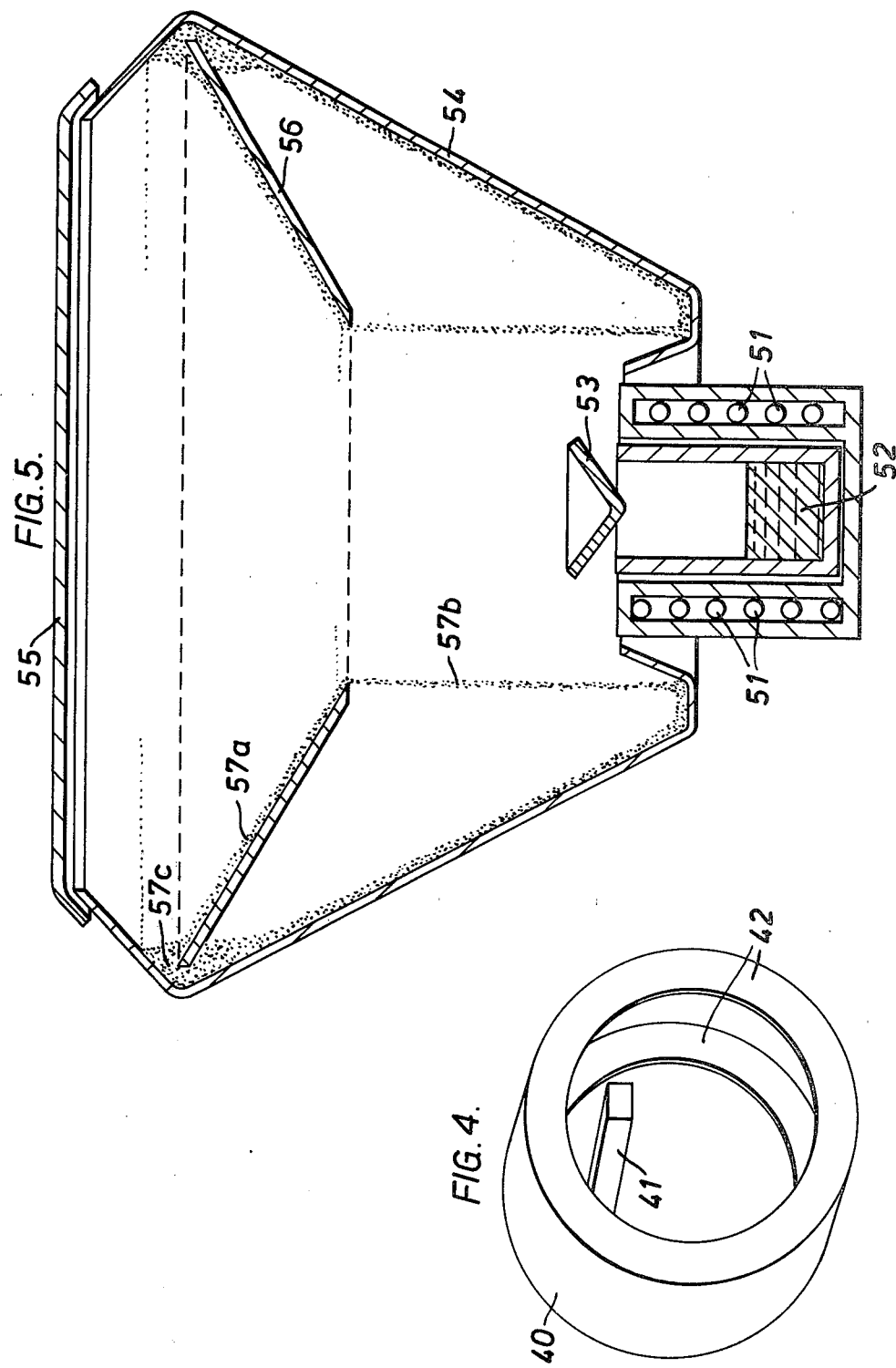

COATING POWDER WITH VALVE-METAL

BACKGROUND OF THE INVENTION

This invention relates to the coating of powders with valve-metal, to the coating of such coated powders with further valve-metal coatings, and to the production of capacitors from the coated powder so formed.

It is known for instance from British Pat. No. 1,030,004 to make capacitors by a method involving the coating of powders with valve-metal by a chemical vapor reaction process. In the case of coating with tantalum, this is typically effected by reacting a tantalum halide with hydrogen. In the case of coating with aluminum, this can be effected by decomposing aluminum tri-isobutyl into aluminum and isobutylene. Typically the powder to be coated is supported in a fluidized bed.

A significant problem with the aluminum deposition process is that the starting compound is organic, and therefore the product is very susceptible to contamination with carbon. In the case of tantalum deposition, one of the problems is that of contamination arising from the highly reactive halide vapors reacting with materials from which the coating apparatus is made.

SUMMARY OF THE INVENTION

We have found that the foregoing problems can be avoided by coating the powder with valve-metal obtained by evaporation. One advantage of this is that the deposition reaction relying upon evaporation/condensation rather than a heterogeneous chemical reaction makes it possible to employ a lower substrate temperature for the powder, which allows the use of a wider range of substrate materials and can reduce mechanical stress problems at the interface between the valve-metal coating and the underlying non-valve-metal material. Another advantage is that evaporation of valve-metals such as aluminum can readily be made to produce a form of growth providing a high specific surface.

An advantage of the physical vapor deposition process over chemical vapor deposition concerns the problem of nucleation. It is essential to have a high degree of supersaturation at the surface of the substrate for the depositing species to achieve a substantially complete coverage of the substrate right from the commencement of the deposition process. An adequate degree of supersaturation is difficult to achieve for reversible reactions. In the case of a chemical vapor reaction, a high substrate temperature is generally necessary for the reaction to proceed at a reasonable rate which militates against supersaturation, whereas with physical vapor deposition a high substrate temperature is generally not required.

Two methods of coating a powder with aluminum obtained by evaporation are described in specifications accompanying our copending patent application Ser. No. 039,625 filed May 16, 1979 now U.S. Pat. No. 4,242,982, to which attention is directed. In both these methods, powder is dispensed from a hopper to fall through a coating region where the powder particles come into contact with aluminum vapor and, after leaving this region, the particles are collected in a suitable receiver. In order to produce thicker coatings of aluminum, it is possible to return the collected powder to the dispensing hopper and to repeat the coating cycle a number of times. However, it is found that the process becomes more difficult to perform satisfactorily when the coating layer gets thicker.

DESCRIPTION OF THE DRAWINGS

There follows a description of methods of coating embodying the present invention in preferred forms. The description refers to the accompanying drawings, in which:

FIG. 2 is a graph showing typical capacitance yields for capacitors made from powder coated in the apparatus of FIG. 1;

FIGS. 4 and 5 depict two further sets of different apparatus for coating powder.

DESCRIPTION OF THE PREFERRED EMBODIMENT

Figure 3:
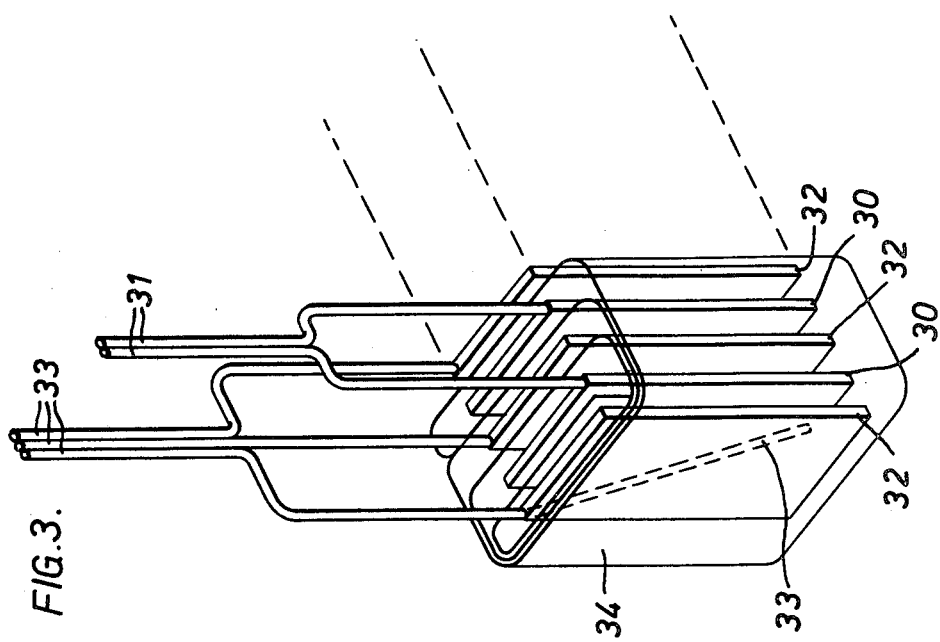
FIG. 3 shows a typical capacitor construction.

The preferred method of coating powder first to be described uses substantially the same apparatus arrangement to generate aluminum vapor as is used in the second method described in the specification referred to above. In this arrangement, aluminum wire 10 is fed on to one face of heater 11 that is relatively resistant to attack by molten aluminum. A preferred heater has the form of electrically conducting refractory slab 11 which may, for instance, consist of a compacted mixture of boron nitride, titanium diboride and a small amount of aluminum nitride. In its "green" state, this material is readily machinable. The slab is provided with a pair of necked regions 12 to produce higher temperature zones near its ends in order to limit the migration of aluminum which wets the surface of the slab and has a tendency to migrate to cooler parts. The slab is held between a pair of water-cooled copper electrodes 13 terminating in copper jaws. In order to take account of differential expansion effects and to provide a low electrical impedance and high thermal impedance connection between the slab and the electrode jaws, the two ends of the slab are wrapped with graphite paper (not shown) before being inserted into the jaws. In one example, a slab was used which was mounted vertically, had a room temperature resistance of 500–550 ohms, and took about 120 amps to heat to about 1600° C.

The aluminum wire, which is typically 0.70 mm in diameter, is fed from a reel (not shown) through a tube 14 on to the face of the hot slab 11 from which aluminum vapor is ejected. A rotating drum 15 is positioned so that the majority of the ejected vapor is directed into its interior where it condenses upon the particles of a charge of powder. The drum is held with its axis of rotation inclined between the horizontal and the vertical so that rotation of the drum causes the powder to tumble. Typically, the drum 15 is rotated at about 30 rpm, but the choice of speed is variable within wide limits depending upon size and conditions. In the case of a drum 7 cm in diameter and 5 cm deep, a typical charge consists of 100 grams of 29 micron alumina powder which has been leached in a dilute solution of hydrochloric acid, washed thoroughly in demineralized water and thoroughly dried. For capacitor manufacture, an electrically insulating powder is generally preferred so that should the valve-metal coating be penetrated by the electrolyte, the exposure of the underlying core material shall not adversely affect the electrical properties. If desired, a larger drum size may be used, also a finer particle size powder. Thus, satisfactory coating is achieved using a 300 gram charge in a 15 cm diameter drum 15 cm deep. This drum is provided with inwardly directed radial vanes to modify the tumbling action of the powder, and also has an inwardly projecting lip at its mouth. Also in addition to coating 29 micron powder, 13 micron powder has successfully been coated.

For the coating process, the assembly of drum, wire and intermetallic slab is mounted inside a vacuum chamber (not shown), which is pumped down to operate at a pressure of less than $10^{-4}$ Torr, typically about $2\times10^{-5}$ Torr. As the deposition proceeds, the coated powder particles begin to show an increasing tendency to stick together and form agglomerates which are not broken up by the tumbling action of the drum rotation. However, it is found that the tumbling action does break up the agglomerates in the presence of oxygen. Therefore, it is convenient to continue the deposition until agglomerates build up. At this stage, the power to the intermetallic slab is switched off, and the feed of aluminum wire halted, while pure oxygen or air is bled into the still rotating drum. If oxygen is used, the pressure in the vacuum system is typically not allowed to rise about $10^{-4}$ Torr, whereas a higher pressure, typically between 1 Torr and atmospheric pressure, is found appropriate when air is used. The reason for maintaining a low pressure at this stage is to reduce the pump down time necessary to restore the vacuum to the level required before recommencement of the deposition once the agglomerates have been sufficiently broken up. This breaking up of agglomerates may take a period of about 15 minutes. The time depends upon the pressure, and thus there is a trade-off between pump down time and speed of break up of agglomerates. The process steps of deposition and of admission of oxygen or air to break up agglomerates are typically performed ten to fifteen times over to build up a deposit about 2 to 3 microns thick. At this stage, the proportion of aluminum, when coating 29 micron alumina, is typically in the range 25 to 30 weight percent.

As an alternative to this intermittent admission of oxygen or air to assist the breaking up of agglomerates, it is possible to prevent their formation by bleeding oxygen directly into the drum at a controlled rate on a continuous basis throughout the whole deposition.

When the coated powder is to be used for the manufacture of a capacitor anode, the actual amount of aluminum required on the powder will, of course, depend upon the forming voltage requirements for that anode. As a general rule, one would expect to use less aluminum when a lower forming voltage is to be used because all that is necessary is to have sufficient aluminum to leave a continuous metallic film after the anodization has been completed. However, we have found that the growth of aluminum occurring with this process appears to be rough on a microscopic scale and we believe that this is the reason that the specific surface increases with increasing aluminum content. Representative examples of capacitance yield are given in the graph of FIG. 2 which refers to capacitance yield obtained at forming voltages of 20 V, 50 V and 100 V using 29 micron alumina powder.

In order to make the anodes, the coated powder was removed from the vacuum system and compacted using a carefully degreased die. A force of about 1350 Newtons was applied to compact 0.05 g samples of powder in a die of cross-section 6 mm by 12 mm. The anode contact was supplied by an aluminum wire included in the die in the known manner used in the manufacture of compacted tantalum capacitor anodes. A compacted anode can be formed by anodization in the normal way at room temperature using a 3% solution of ammonium tartrate. Alternatively, it can be formed at the elevated temperature of 85° C. using an 8% solution of boric acid. In the case of forming with boric acid the use of an alkali to buffer the solution to pH of 5.5 was found to give rise to the problem of the formation of a white deposit in the pores, and for this reason an unbuffered solution is preferred.

FIG. 3 shows a typical construction of capacitor using a wet working electrolyte in which a number of anodized compacted coated powder slabs 30 having parallel connected leads 31 is interleaved with a set of unanodized compacted powder slabs 32 having parallel connected leads 33. Except for the absence of anodization, the slabs 32 are identical with the slabs 30, although passivation treatments known for etched/oil cathodes may be given. In order to realize the full capacitance, the number of slabs 30 is one less than that of the slabs 32 so that each slab 30 is sandwiched between one pair of slabs 32. The slabs are separated by one thickness of manila paper 34 wrapped around the components of the assembly. This method of construction allows the slabs to be maintained in close proximity, with the paper 34 acting as a reservoir for the working electrolyte. This may be, for instance, a standard organic electrolyte formation based on $\gamma$-butyrolactone and n-methyl-2-pyrrolidone.

A typical capacitor constructed in this way from four parallel connected "cathode" slabs 32, in which each slab measured 6 mm$\times$12 mm$\times$0.7 mm, had its anodes formed to 200 volts in 3% ammonium tartrate in order to provide a working voltage of 160 volts. Following assembly, the unit was vacuum impregnated with an organic working electrolyte having a maximum working voltage of 200 volts and a measured conductivity of 2000 micro-Siemens at 25° C. Vacuum impregnation was carried out using a vacuum desiccator and a water pump. No prebake was given. After this treatment, the unit was placed in a small glass container which was closed by a tight-fitting plastics lid through which emerged the leads 31 and 33. The device was then post-formed at 180 volts for 2 hours and again exposed to vacuum to remove any gas evolved during the post-formation. On completion, measurements carried out on a bridge at 160 volts and a frequency of 120 Hz revealed the capacitor to have a capacitance of 12.0 micro-Farads, a tan-delta of 8.5%, and a leakage current of 35 microamps. Subsequently, the device was put on life test at 160 volts for 144 hours after which the measured parameters were capacitance 11.8 micro-Farads, tan-delta 8.5%, and leakage current 14 microamps.

The coated powder may also be used to form the anode of a solid electrolyte capacitor in which case the anode will normally be in the form of a single block, which is formed to give it its anodized layer, and then has its pores filled with solid electrolyte such as manganese dioxide using the standard manganizing process used for making solid electrolytic tantalum capacitors.

Figure 1:
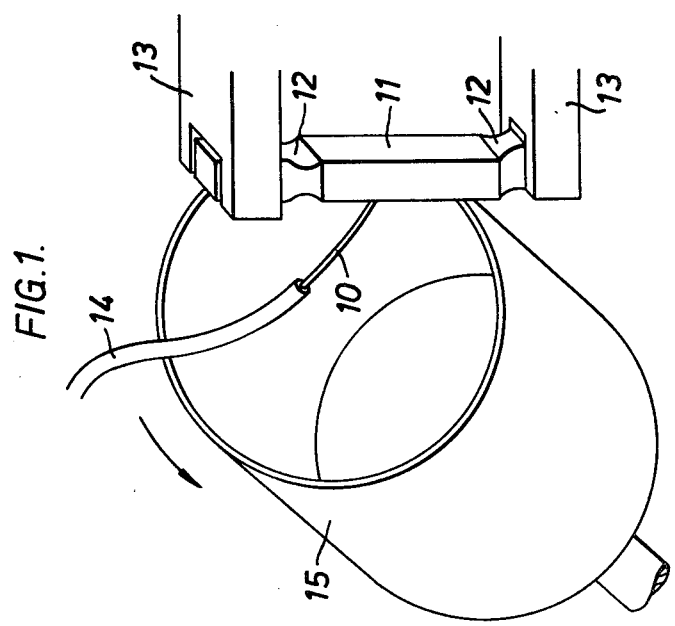
FIG. 1 depicts a first apparatus for coating powder with aluminum.

An alternative method of coating powder will now be described with reference to FIG. 4. The apparatus used in this method is designed for an evaporator system in which the valve-metal vapor issues upwardly from the surface of a melt. A drum 40 containing the powder to be coated, typically alumina, is rotated about its axis which is held horizontal. The speed of rotation is such as to carry the powder around with the drum, even at the highest point by centrifugal action. Stationary within the rotating drum is located a 270° or other suitable type of electron beam evaporator 41 which is arranged to form a molten pool of valve-metal, typically aluminum or tantalum. The vapor evaporated from this molten pool condenses on the powder as it passes overhead. In order that the same surfaces of the powder particles shall not be presented to the vapor with each revolution of the drum, the powder is agitated on each cycle by passing it through a spoiler, not shown, provided near the bottom of the drum. This apparatus, like the apparatus of FIG. 1, is contained within a vacuum vessel (not shown). During the coating process, the pressure in this vessel is typically maintained at a pressure of about $2 \times 10^{-5}$ Torr.

Aluminum can be evaporated at a reasonable rate by maintaining the evaporation source at a temperature in the range 1250° to 1300° C. At a temperature of 1284° C., the vapor pressure of aluminum is 1 Torr. To achieve the corresponding vapor pressure for evaporating tantalum requires a temperature of 3500° C. Clearly at this higher temperature there is going to be much greater loss of heat by radiation. At 1284° C., the radiated energy is 33.5 watts/cm$^2$ whereas at 3500° C., it is 1.15 kwatts/cm$^2$. Against this, however, must be set the fact that the latent heat of vaporization for tantalum is smaller than that for aluminum, and thus it takes about 8.3 kwatts to supply the latent heat energy requirement necessary to evaporate aluminum at the rate of 1 gram per second, whereas it takes only about 5 kwatts to supply the latent heat energy requirement to evaporate tantalum at the same rate. It follows therefore that a 100 kwatt electron beam evaporator is readily capable of evaporating tantalum at a reasonable rate notwithstanding the fact that much higher temperatures are involved. In fact, because the latent heat is smaller and its melting point is higher, it is feasible to deposit tantalum at a faster rate than aluminum without the problem of post-diffusion due to the heating of the substrate by the heat of condensation.

In addition, in the case of tantalum, due to its much higher melting point relative to aluminum, a higher substrate temperature can be tolerated without reducing the level of supersaturation to the point where nucleation problems becomes significant.

The manufacture of tantalum capacitors from this tantalum coated powder is carried out by methods conventionally used in the manufacture of all-tantalum compacted powder capacitors involving compaction, or sintering, or both compacting and sintering, followed by forming and then manganizing.

In a modified form of the apparatus of FIG. 4, the lips 42 located at either end of the drum which serve to prevent powder spillage are dispensed with and the spoiler (not shown) is arranged to feed the powder gradually in an axial direction from one side to the other. In this way, uncoated powder can be fed in to one side of the drum on a semi-continuous basis to emerge fully coated from the other.

For the evaporation of aluminum, an RF induction heated vessel may be used in place of the electron beam evaporator. In the apparatus of FIG. 5, such a vessel is depicted at 50 with its RF coils 51. The vessel 50 contains a charge 52 of aluminum which provides a source of aluminum vapor that is reflected by the vessel lid 53 to emerge from the vessel substantially horizontally. For this purpose, it may be arranged that the lid is heated not only by radiation from the source of molten metal, but also by being coupled into the RF field of the evaporation vessel 50.

A rotating drum 54 held with its axis vertical surrounds the vessel 50 which is stationary. Covering the drum is a fixed lid 55 from which is suspended a stationary conical shute 56 having the general shape of a Bellville washer. Powder 57a on the upper surface of the shute 56 descends under gravity down its slope towards its central aperture, from where it falls freely in a curtain 57b around the vessel 50. As it passes the gap between the vessel and its lid, it receives a coating of aluminum. The powder then falls to the bottom of the drum 53 from where it is caused by centrifugal action to rise up the outwardly tapering sides of the drum. Near the top of the drum the outward taper is transformed into an inward taper, and here the powder collects at 57c. The outer rim of the stationary shute 56 dips into this accumulation of the powder. It slows the rotational speed of the powder in its vicinity, and hence the powder that is immediately above it descends its slope to be replenished by more powder from the bottom of the drum. The powder for coating is typically alumina, and the coating process is carried out in a vacuum vessel (not shown).

In the foregoing description of examples of the invention, the only material specifically exemplified upon which to deposit the coating has been alumina powder. It is to be understood, however, that many other materials can be used in its place. In the provision of aluminum coated powder for capacitor manufacture, a property desired of the underlying core is that it shall be less ductile than aluminum so that the processing necessary to form a coherent body from the coated powder shall the more easily leave that body in a porous state. It will be clear that if the valve-metal coating does not completely cover the powder, or at some stage becomes ruptured, the underlying material will become exposed to the electrolyte and hence, must be compatible with it in the sense that it must not significantly degrade the electrical characteristics of the capacitor. For this reason, it is generally preferred to use a dielectric material for the powder.

Alumina has been featured in all the examples because its use as an industrial abrasive means that it is readily available in a suitable form in specific particle sizes. It is inert in this application and is relatively cheap. Yet, it is feasible to be deposited upon a very wide range of powdered substrate materials having regard to their suitability in respect of melting point, vapor pressure and ductility. The particular choice of substrate will also depend upon compatibility having regard to the final application of the product, the cost and availability. For alumina deposition, glasses and resins should prove suitable for many applications.

In the case of aluminum electrolytic capacitor manufacture, an important reason for choosing the coated power in preference to the use of pure all-aluminum powder concerns the processing necessary to produce the porous coherent body of compacted powder. This is difficult to achieve with pure all-aluminum powder because the ductility is so great that compaction is liable to eliminate the pores from the structure. In the case of tantalum electrolytic capacitor manufacture, the reason for choosing this in preference to pure all-tantalum powder is primarily one of cost. For this reason, the amount of tantalum used to coat the powder is kept to a minimum that will meet the performance requirements. If the tantalum coating is applied directly on to dielectric powder, the calculation of the thickness of coating required must make allowance not only for the amount of metal to be converted to oxide by the forming process, but also for the requirement of sufficient residual underlying unconverted metal to form the electrode structure. This unconverted metal does not have to be tantalum, but may be made of a cheaper valve-metal such as aluminum. Therefore, the powder may first be coated with aluminum and then with tantalum. The tantalum is provided in just sufficient quantity to satisfy the forming requirements. Any breaks in the resulting anodic film of tantalum dioxide will be filled with material created by the anodization of the underlying aluminum. The resulting capacitor anode will have much more anodized tantalum than anodized aluminum and hence, its properties will be much closer to those of an all-tantalum coated powder capacitor than an all-aluminum coated powder one.

It will be appreciated that this type of process of depositing a high melting point metal on a relatively lower melting point metal is generally possible with the physical vapor deposition process, whereas with chemical vapor deposition, it may be difficult or impossible because of conflicting requirements concerning substrate temperature.

In the literature, there are described many alloys which exhibit valve-metal properties. Such valve-metals may be alloys that contain one or more constituent elements that are not themselves valve-metals. It is to be clearly understood that although the only valve-metals specifically exemplified above have been elemental metals, the invention is applicable also to coating with valve-metals which are alloys. It is well known to deposit alloy systems by evaporation using common or separate sources.

We claim:

1. A method of coating powder particles with valve metals, comprising the steps of confining the particles to be coated in the interior of a rotatable drum; exposing the particles to an evacuated atmosphere; introducing vapors of at least one valve metal into the evacuated atmosphere, including evaporating the valve metal; presenting the particles to the vapors wherein the particles are coated with a layer of elemental valve metal, including rotating the drum and entraining the particles for joint travel with the rotating drum; and countering the tendency of the coated particles to form agglomerates, including at least occasionally enriching the evacuated atmosphere with oxygen at a controlled rate sufficient for substantially preventing the formation of such agglomerates.

2. A method as claimed in claim 1, where said countering step includes performing said enriching step only during a respective time interval preceded and succeeded by operation without the performance of said enriching step; and further comprising the step of discontinuing said introducing step during said time interval to permit any previously formed agglomerates to disintegrate during the continuing rotation of the drum.

3. A method as claimed in claim 1, and further comprising the step of repeating said introducing step with a different valve metal after the termination of said introducing step with said one valve metal to coat the particles already coated with said one valve metal with a layer of said different valve metal.

4. A method as claimed in claim 1, wherein the powder particles are less ductile than the material with which they are being coated.

5. A method as claimed in claim 1 wherein the drum is rotated about a horizontal axis at a speed which allows the powder to be coated while held against the drum wall by centrifugal action as it passes over an evaporation source.

6. A method as claimed in claim 1, wherein the drum is rotated about a horizontal axis at a speed which allows the powder to be coated while held against the drum wall by centrifugal action as it passes over an evaporation source, and wherein a spoiler causes the powder to advance along the drum in an axial direction.

7. A method as claimed in claim 1, wherein the drum is rotated about a vertical axis and is provided with tapering sides that cooperate with a fixed plate to cause the powder to circulate within the drum, advancing up its sides, descending the fixed plate, and falling in a curtain around the evaporation source.

8. A method as claimed in claim 1, wherein the vapor is obtained by advancing metal stock against a hot surface.

9. A method as claimed in claim 8, wherein the hot surface is provided by an electrically conducting refractory block heated by Joule heating.

10. A method as claimed in claim 9, wherein the block consists of a compacted mixture of boron nitride, titanium diboride and aluminum nitride.

11. A method as claimed in claim 1, wherein the valve-metal is aluminum or an alloy thereof.

12. A method as claimed in claim 1, wherein the valve-metal is tantalum or an alloy thereof.

13. A method as claimed in claim 1, wherein the powder consists of particles of alumina.

14. A method as claimed in claim 1, wherein the powder consists of particles of glass.

15. A method as claimed in claim 1, wherein the powder consists of particles of resin.

16. A method as claimed in claim 1, wherein the powder is first coated with a valve-metal of one composition and is then coated with a valve-metal of a different composition.

17. A method of coating powder particles with valve metals, comprising the steps of confining the particles to be coated in the interior of a drum rotatable about a vertical axis and having an upwardly diverging internal surface and a limiting surface extending toward the vertical axis from the upper end of the internal surface to form a corner region with the latter; exposing the particles in the drum to an evacuated atmosphere; introducing vapors of at least one valve metal into the evacuated atmosphere, including evaporating the valve metal from a source centrally disposed in the drum; and presenting the particles to the vapors for deposition of the valve metal thereon, including rotating the drum at such a speed that centrifugal forces acting on the particles entrained by the drum for joint travel therewith cause such particles to ascend the upwardly diverging internal surface and to accumulate in the corner region, and forming a curtain of decending particles around the source, including so situating a stationary member having a downwardly coverging upper surface and a central opening at the upper region of the drum as to extend into the particles accumulated in the corner region and cause the same to slide on the downwardly coverging upper surface toward and through the central opening for descent around the source to the bottom of the drum.

* * * * *